United States Patent
Ruhland et al.

(10) Patent No.: US 12,125,728 B2
(45) Date of Patent: Oct. 22, 2024

(54) SUBSTRATE CARRIER

(71) Applicant: APPLIED MATERIALS, INC., Santa Clara, CA (US)

(72) Inventors: Fred Eric Ruhland, Pleasanton, CA (US); Sumit S. Patankar, Fremont, CA (US); Vijay D. Parkhe, San Jose, CA (US); Daniel Lee Diehl, Chiba (JP); Mingwei Zhu, Sunnyvale, CA (US); Hiroyuki Takahama, Chiba-ken (JP); Randy D. Schmieding, Saratoga, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 477 days.

(21) Appl. No.: 16/746,285

(22) Filed: Jan. 17, 2020

(65) Prior Publication Data
US 2020/0234991 A1    Jul. 23, 2020

Related U.S. Application Data

(60) Provisional application No. 62/794,921, filed on Jan. 21, 2019.

(51) Int. Cl.
*H01L 21/67*     (2006.01)
*H01L 21/677*    (2006.01)

(52) U.S. Cl.
CPC .............................. *H01L 21/67754* (2013.01)

(58) Field of Classification Search
CPC .. H01L 21/67754; H01L 21/687; B05C 13/02
See application file for complete search history.

(56) References Cited

U.S. PATENT DOCUMENTS

| D44,126 S | 8/1913 | Haekold |
|---|---|---|
| D411,261 S | 6/1999 | Movsesian |
| 7,625,448 B2 | 12/2009 | Dauelsberg et al. |

(Continued)

FOREIGN PATENT DOCUMENTS

| CN | 202384308 U | 8/2012 |
|---|---|---|
| CN | 204959030 U | 1/2016 |

(Continued)

OTHER PUBLICATIONS

Search Report for Taiwan Design Application No. 108304381, dated Jul. 29, 2020.

(Continued)

*Primary Examiner* — Ronald P Jarrett
(74) *Attorney, Agent, or Firm* — MOSER TABOADA

(57) ABSTRACT

Embodiments of a substrate carrier are provided herein. In some embodiments, a substrate carrier includes a base plate, wherein the base plate is a thin, solid plate with no through holes or embedded components; and a plurality of raised portions extending from the base plate, wherein the plurality of raised portions include first raised portions and second raised portions, the first raised portions disposed radially inward from the second raised portions, wherein the base plate and the plurality of raised portions define pockets configured to retain a plurality of substrates, and wherein an upper surface of the second raised portions have a greater surface area than an upper surface of the first raised portions.

20 Claims, 3 Drawing Sheets

(56) References Cited

U.S. PATENT DOCUMENTS

| | | |
|---|---|---|
| D697,778 S | 1/2014 | Bozic |
| D751,999 S | 3/2016 | Sharma et al. |
| 9,845,533 B2 | 12/2017 | Thirunavukarasu et al. |
| D813,635 S | 3/2018 | Brutscher et al. |
| D817,696 S | 5/2018 | Mirchandani et al. |
| 9,988,712 B2 * | 6/2018 | Sufan .................. C23C 16/4583 |
| D834,722 S | 11/2018 | Sugie |
| D835,799 S | 12/2018 | Ito et al. |
| D835,800 S | 12/2018 | Ito et al. |
| D835,804 S | 12/2018 | Ito et al. |
| D836,211 S | 12/2018 | Ito et al. |
| D838,001 S | 1/2019 | Ito et al. |
| D854,184 S | 7/2019 | Ito et al. |
| D855,207 S | 7/2019 | Ito et al. |
| D855,209 S | 7/2019 | Ito et al. |
| D859,058 S | 9/2019 | Mirchandani et al. |
| D877,101 S | 3/2020 | Johanson et al. |
| 2010/0162957 A1 | 7/2010 | Boyd et al. |
| 2010/0273314 A1 * | 10/2010 | Ishikawa ............. C23C 16/4583 |
| | | 257/E21.09 |
| 2013/0164688 A1 * | 6/2013 | Cadee ................... G03B 27/58 |
| | | 355/72 |
| 2016/0133782 A1 | 5/2016 | Thirunavukarasu et al. |
| 2018/0012790 A1 | 1/2018 | Parkhe |
| 2019/0181029 A1 | 6/2019 | Matsuzaki |

FOREIGN PATENT DOCUMENTS

| | | | |
|---|---|---|---|
| CN | 105810626 A | 7/2016 | |
| DE | 102014114941 A1 | 11/2015 | |
| JP | WO2012172920 | * 12/2012 | ........... H01L 21/683 |

OTHER PUBLICATIONS

Silicon wafers, substrates and specimen supports. Online, published dated unknown. Retrieved on Apr. 24, 2020 from URL: https://www.labtech-em.com/em/silicon-wafers-substrates-and-specimen-support.

* cited by examiner

SUBSTRATE CARRIER

CROSS-REFERENCE TO RELATED APPLICATIONS

This application claims benefit of U.S. provisional patent application Ser. No. 62/794,921, filed Jan. 21, 2019, which is herein incorporated by reference in its entirety.

FIELD

Embodiments of the present disclosure generally relate to substrate processing equipment.

BACKGROUND

Substrates to be processed are transferred to different chambers and areas using carriers that enable the transfer of multiple substrates at a time. One such carrier used in aluminum nitride deposition for light emitting diode (LED) applications, in which substrates between 2-6 inches are used, is a 300 mm silicon (Si) substrate carrier. The Si substrate carrier is formed of single crystal silicon that is machined with pockets to carry the substrates. However, Si substrate carriers tend to break during processing, cleaning, and/or refurbishment. Alternatively, silicon carbide (SiC) substrate carriers may be used since a SiC substrate is about 40% more dense than a silicon substrate. However, because of the increased density, SiC substrate carriers are heavier and can, therefore, damage a substrate support on which they are placed. Also, SiC substrate carriers can also chip and crack leading to low yield.

Accordingly, the inventors have provided embodiments of improved substrate carriers as disclosed herein.

SUMMARY

Embodiments of a substrate carrier are provided herein. In some embodiments, a substrate carrier includes a base plate, wherein the base plate is a thin, solid plate with no through holes or embedded components; and a plurality of raised portions extending from the base plate, wherein the plurality of raised portions include first raised portions and second raised portions, the first raised portions disposed radially inward from the second raised portions, wherein the base plate and the plurality of raised portions define pockets configured to retain a plurality of substrates, and wherein an upper surface of the second raised portions have a greater surface area than an upper surface of the first raised portions.

In some embodiments, a substrate carrier includes a base plate having a central substrate retaining surface, and a plurality of peripheral substrate retaining surfaces; a plurality of first raised portions defining the central substrate retaining surface; and a plurality of second raised portions, which along with the plurality of first raised portions, define the plurality of peripheral substrate retaining surfaces, wherein each second raised portion of the plurality of second raised portions at least partially defines adjacent peripheral substrate retaining surfaces, and wherein the substrate carrier is made of silicon-infiltrated, silicon carbide (SiSiC).

In some embodiments, a substrate carrier includes a base plate, wherein the base plate is a solid plate with no through holes or embedded components; and a plurality of raised portions that are generally triangular shaped extending from the base plate, wherein the base plate and the plurality of raised portions define a plurality of pockets having a circular shape, and wherein the plurality of pockets include a central pocket and a six peripheral pockets.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
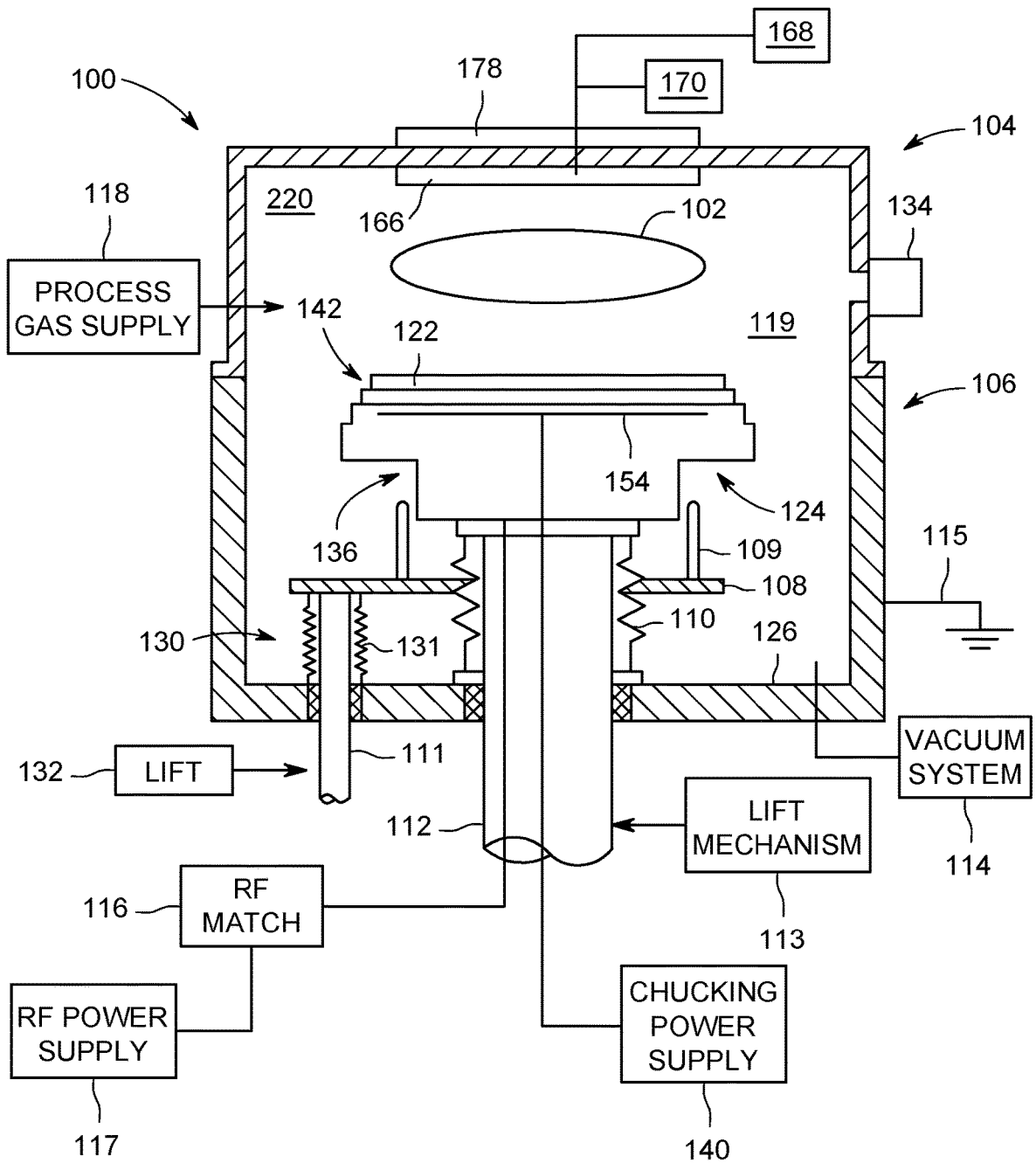
FIG. 1 depicts a schematic cross-sectional view of a deposition chamber in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of a substrate carrier are provided herein. The substrate carrier can be used, for example, to support substrates (such as semiconductor substrates) in thin film and microelectronic fabrication processes. In some embodiments, the carrier integrates use of a ceramic material, such as silicon (Si) or silicon carbide (SiC). In some embodiments, the ceramic material is silicon-infiltrated, silicon carbide (SiSiC), to advantageously reduce breakage and improving fabrication yield. The carrier includes a base plate having raised portions to define pockets, advantageously reducing or eliminating stresses associated with forming pockets into a substrate carrier. In some embodiments, the carrier advantageously includes seven pockets to accommodate seven substrates having a diameter of about 4.0 inches for processing.

The substrate carrier may be used with suitable multi-chamber processing systems that include the ENDURA® and CENTURA® processing systems or other suitable processing systems commercially available from Applied Materials, Inc., located in Santa Clara, California. Other processing systems (including those from other manufacturers) may be adapted to benefit from the embodiments disclosed herein. The multi-chamber processing systems may be configured to perform various functions including layer deposition including atomic layer deposition (ALD), chemical vapor deposition (CVD), physical vapor deposition (PVD), etch, pre-clean, de-gas, orientation and center-finding, annealing, and other substrate processes.

FIG. 1 depicts a schematic cross-sectional view of a deposition chamber in accordance with some embodiments of the present disclosure. In some embodiments, the plasma processing chamber is a physical vapor deposition (PVD) processing chamber. However, other types of processing chambers configured for different processes can also use or be modified for use with embodiments of the substrate carrier.

In some embodiments, a chamber 100 is a vacuum chamber which is suitably adapted to maintain sub-atmospheric pressures within a chamber interior volume 120 during substrate processing. The chamber 100 includes a chamber body 106 covered by a lid 104 which encloses a processing volume 119 located in an upper portion of chamber interior volume 120. A slit valve 134 is coupled to the chamber body 106 and configured to facilitate transfer of a substrate 122 into and out of the chamber 100. The chamber body 106 and lid 104 may be made of metal, such as aluminum. The chamber body 106 may be grounded via a coupling to ground 115.

A substrate support 124 is disposed within the chamber interior volume 120 to support and retain a substrate carrier 142 and the substrate 122, such as a semiconductor wafer, for example. The substrate support 124 may generally comprise a pedestal 136 that includes a dielectric body having one or more electrodes 154 disposed therein and a hollow support shaft 112 for supporting the pedestal 136. The hollow support shaft 112 provides a conduit to provide, for example, gases, fluids, coolants, power, or the like, to the pedestal 136.

Figure 2:
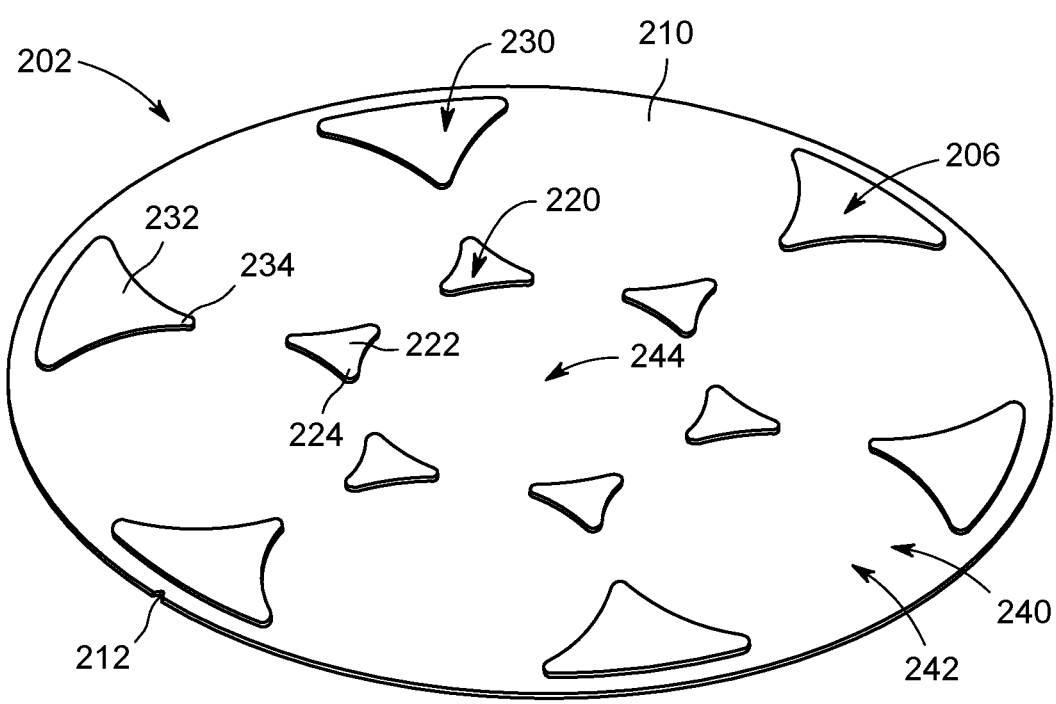
FIG. 2 depicts an isometric view of a substrate carrier in accordance with some embodiments of the present disclosure.

In some embodiments, the hollow support shaft 112 is coupled to a lift mechanism 113, such as an actuator or motor, which provides vertical movement of the electrostatic chuck 150 between an upper, processing position (as shown in FIG. 2) and a lower, transfer position (not shown). A bellows assembly 110 is disposed about the hollow support shaft 112 and is coupled between the pedestal 136 and a bottom surface 126 of chamber 100 to provide a flexible seal that allows vertical motion of the pedestal 136 while preventing loss of vacuum from within the chamber 100.

The hollow support shaft 112 provides a conduit for coupling a chucking power supply 140 and RF sources (e.g., RF plasma power supply 170 and RF bias power supply 117) to the pedestal 136. In some embodiments, RF plasma power supply 170 and RF bias power supply 117 are coupled to the electrostatic chuck via respective RF match networks (only RF match network 116 shown). In some embodiments, the substrate support may alternatively include AC, DC, or RF bias power.

A substrate lift 130 can include lift pins 109 mounted on a platform 108 connected to a shaft 111 which is coupled to a second lift mechanism 132 for raising and lowering the substrate lift 130 so that the substrate carrier 142 and the substrate 122 may be placed on or removed from the pedestal 136. The pedestal 136 includes thru-holes to receive the lift pins 109. A bellows assembly 131 is coupled between the substrate lift 130 and bottom surface 126 to provide a flexible seal which maintains the chamber vacuum during vertical motion of the substrate lift 130.

The chamber 100 is coupled to and in fluid communication with a vacuum system 114 which includes a throttle valve (not shown) and vacuum pump (not shown) which are used to exhaust the chamber 100. The pressure inside the chamber 100 may be regulated by adjusting the throttle valve and/or vacuum pump. The chamber 100 is also coupled to and in fluid communication with a process gas supply 118 which may supply one or more process gases to the chamber 100 for processing a substrate disposed therein. The process gas may be a sputtering gas, or a reactive gas. In some embodiments, the process gas includes aluminum nitride (AlN).

In operation, for example, a plasma 102 may be created in the chamber interior volume 120 to perform one or more processes. The plasma 102 may be created by coupling power from a plasma power source (e.g., RF plasma power supply 170) to a process gas to ignite the process gas and create the plasma 102. In some embodiments, a bias power may also be provided from a bias power supply (e.g., RF bias power supply 117) to one or more electrodes 154 within the pedestal 136 to attract ions from the plasma towards the substrate 122. The electrostatic chuck may have a particular thickness above the electrode.

In some embodiments, for example where the chamber 100 is a PVD chamber, a target 166 comprising a source material to be deposited on a substrate 122 may be disposed above the substrate and within the chamber interior volume 120. The target 166 may be supported by a grounded conductive portion of the chamber 100, for example an aluminum adapter through a dielectric isolator. In other embodiments, the chamber 100 may include a plurality of targets in a multi-cathode arrangement for depositing layers of different material using the same chamber.

A controllable DC power source 168 may be coupled to the chamber 100 to apply a negative voltage, or bias, to the target 166. The RF bias power supply 117 may be coupled to the substrate support 124 in order to induce a negative DC bias on the substrate 122. In some embodiments, an RF plasma power supply 170 may also be coupled to the chamber 100 to apply RF power to the target 166 to facilitate control of the radial distribution of a deposition rate on substrate 122. In operation, ions in the plasma 102 created in the chamber 100 react with the source material from the target 166. The reaction causes the target 166 to eject atoms of the source material, which are then directed towards the substrate 122, thus depositing material. The deposited material may be, for example, the deposited material may be AlN, or the like.

In some embodiments, the chamber 100 further includes a magnetron assembly 178. The magnetron assembly 178 provides a rotating magnetic field proximate the target 166 to assist in plasma processing within the chamber 100. In some embodiments, the magnetron assembly 178 includes a plurality of magnets that rotate about a central axis of the chamber 100

Figure 3:
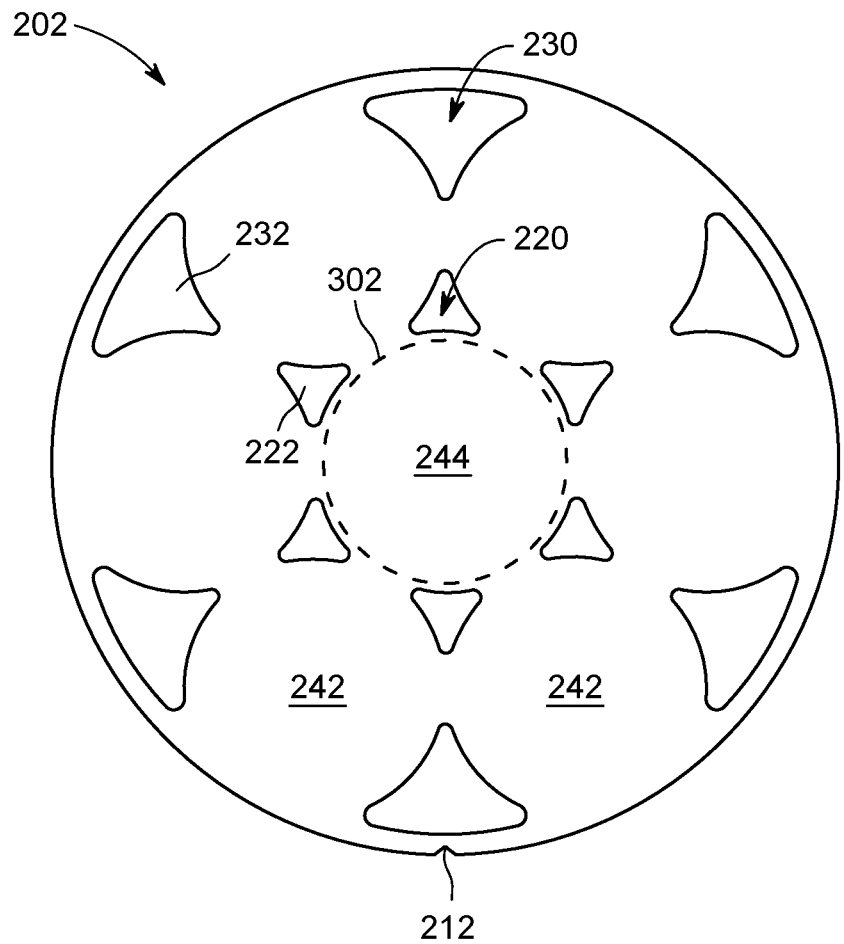
FIG. 3 depicts a top view of the substrate carrier of FIG. 2.

FIG. 2 depicts an isometric view of a substrate carrier 202 in accordance with some embodiments of the present disclosure. FIG. 3 depicts a top view of the substrate carrier 202. In some embodiments, the substrate carrier 202 is the substrate carrier 142 described with respect to FIG. 1. The substrate carrier 202 includes a base plate 210. In some embodiments, the base plate 210 is a thin, solid plate with no through holes or embedded components. In some embodiments, the base plate 210 has a thickness of about 0.03 inches to about 0.05 inches. In some embodiments, the base plate 210 is made of Si or SiC. In some embodiments, the base plate 210 is made of SiSiC. In some embodiments, the base plate 210 has an outer diameter of about 11.5 inches to about 12.5 inches, although other outer diameters may also be used. In some embodiments, the base plate 210 includes a notch 212 that extends radially inward from an outer sidewall of the base plate 210. The notch 212 is configured to align the substrate carrier to other components during processing or transfer.

The substrate carrier 202 includes a plurality of raised portions 206 extending from the base plate 210. The plurality of raised portions 206 include first raised portions 220 and second raised portions 230. The first raised portions 220 are disposed radially inward from the second raised portions 230. In some embodiments, the second raised portions 230 are larger than the first raised portions 220, for example, an upper surface 232 of each of the second raised portions 230 has a greater surface area than an upper surface 222 of each of the first raised portions 220. In some embodiments, the plurality of raised portions 206 extend about 0.01 inches to about 0.04 inches from the base plate 210. In some embodiments, the plurality of raised portions 206 extend about 0.02 inches to about 0.03 inches from the base plate 210.

The base plate 210 and the plurality of raised portions 206 define pockets 240, or substrate retaining surfaces, configured to retain a plurality of substrates (e.g., substrate 302 shown in phantom in FIG. 3) on the substrate carrier. In some embodiments, the pockets 240 are configured to retain substrates having a thickness of about 350 micrometers to about 1025 micrometers. In some embodiments, the pockets 240 are circular in shape. In some embodiments, the pockets 240 include a central pocket 244 and peripheral pockets 242. The plurality of raised portions 206 are configured to only partially surround the plurality of substrates, advantageously reducing the weight of the substrate carrier. At least four raised portions of the plurality of raised portions 206 are disposed around each substrate 302 to ensure that each substrate 302 is sufficiently held in place.

In some embodiments, the first raised portions 220 are disposed equidistant about a center of the base plate 210. The first raised portions 220 have three sides to define a generally triangular shape. In some embodiments, the three sides of the first raised portions 220 of each first raised portions 220 are curved inward towards a center of each first raised portion 220 to correspond with a curvature of a semiconductor substrate. In some embodiments, each of the first raised portions 220 partially define three adjacent pockets 240 (e.g., the central pocket 244 and two adjacent peripheral pockets 242). In some embodiments, the first raised portions 220 include a radius 224 between adjacent sides. In some embodiments, the radius 224 is about 0.07 inches to about 0.13 inches. In some embodiments, the substrate carrier includes six first raised portions 220. In some embodiments, a side of each one of the first raised portions 220 facing the center of the base plate 210 is curved radially outward to define the central pocket 244 configured to retain a substrate. In some embodiments, the central pocket 244 is configured to retain a substrate having a diameter of about 4.0 inches.

In some embodiments, the second raised portions 230 are disposed equidistant about a center of the base plate 210. In some embodiments, the second raised portions 230 are disposed about 7.5 inches or greater from a center of the base plate 210. In some embodiments, the second raised portions 230 have three sides to form a generally triangular shape. In some embodiments, two of the three sides of each one of the second raised portions 230 are curved inward towards a center of each one of the second raised portions 230 to correspond with a curvature of a semiconductor substrate. In some embodiments, each of the second raised portions 230 defines two adjacent pockets of the peripheral pockets 242. In some embodiments, the second raised portions 230 include a radius 234 between adjacent sides. In some embodiments, the radius 234 is about 0.12 inches to about 0.18 inches. In some embodiments, the substrate carrier includes six second raised portions 230. In some embodiments, the side of each one of the second raised portions 230 that is not defining a peripheral pocket 242 is curved outward away from the center of each one of the second raised portions 230 to correspond with a curvature of an outer sidewall of the base plate 210. In some embodiments, the peripheral pockets 242 are configured to retain a substrate having a diameter of about 4.0 inches. In some embodiments, the second raised portions 230 are disposed radially inwards from an outer sidewall of the base plate 210.

In some embodiments, two of the first raised portions 220 and two of the second raised portions 230 have a curved side to define each peripheral pocket 242. In some embodiments, the plurality of raised portions 206 includes six first raised portions 220 and six second raised portions 230 configured to define the central pocket 244 and six peripheral pockets 242 to accommodate seven substrates therein.

While the foregoing is directed to embodiments of the present disclosure, other and further embodiments of the disclosure may be devised without departing from the basic scope thereof.

The invention claimed is:

1. A substrate carrier, comprising:
a base plate, wherein the base plate is a thin, solid plate with no through holes or embedded components; and
a plurality of raised portions extending from the base plate, wherein the plurality of raised portions include first raised portions and second raised portions, the first raised portions disposed radially inward from the second raised portions, wherein the base plate and the plurality of raised portions define pockets configured to retain a plurality of substrates, wherein the plurality of raised portions, together, define sidewalls of the pockets that are configured to only partially surround the plurality of substrates, and wherein an upper surface of each second raised portion has a greater surface area than an upper surface of each first raised portion, wherein an upper surface of the base plate is substantially planar outside of regions corresponding with the plurality of raised portions; wherein a bottom surface of each of the pockets is planar and continuous, and wherein the sidewalls of each of the pockets extend at a constant diameter from the bottom surface to an uppermost surface of respective ones of the plurality of raised portions.

2. The substrate carrier of claim 1, wherein the substrate carrier is made of silicon (Si), silicon carbide (Sic), or silicon-infiltrated, silicon carbide (SiSiC).

3. The substrate carrier of claim 1, wherein the upper surface of the plurality of raised portions is entirely planar and sidewalls of the plurality of raised portions extend vertically from the upper surface of the base plate to the upper surface of the plurality of raised portions.

4. The substrate carrier of claim 1, wherein the pockets include a central pocket and the first raised portions are disposed about a center of the base plate and have a side facing the center that is curved radially outward from the center to define the central pocket.

5. The substrate carrier of claim 1, wherein the first raised portions include a radius between adjacent sides, wherein the radius is about 0.07 to about 0.13 inches.

6. The substrate carrier of claim 1, wherein the plurality of raised portions include six first raised portions and six second raised portions configured to define a central pocket and six peripheral pockets.

7. The substrate carrier of claim 6, the central pocket and peripheral pockets are each configured to hold a substrate having a diameter of about 4.0 inches.

8. The substrate carrier of claim 1, wherein the base plate has a thickness of about 0.03 inches to about 0.05 inches.

9. A substrate carrier, comprising:
a base plate having a central substrate retaining surface, and a plurality of peripheral substrate retaining surfaces;
a plurality of discrete first raised portions defining the central substrate retaining surface; and
a plurality of discrete second raised portions, which along with the plurality of discrete first raised portions, define the plurality of peripheral substrate retaining surfaces, wherein each second raised portion of the plurality of discrete second raised portions at least partially defines adjacent peripheral substrate retaining surfaces, wherein the plurality of discrete second raised portions are a different size than the plurality of discrete first raised portions, and wherein the substrate carrier is made of silicon-infiltrated, silicon carbide (SiSiC), and wherein an upper surface of the base plate is configured to contact an entirety of a backside of a substrate when disposed in the plurality of peripheral substrate retaining surfaces, and wherein the plurality of peripheral substrate retaining surfaces are planar and continuous.

10. The substrate carrier of claim 9, wherein the base plate is a thin, solid plate with no through holes or embedded components.

11. The substrate carrier of claim 9, wherein the plurality of discrete first raised portions extend about 0.01 inches to about 0.04 inches from the base plate.

12. The substrate carrier of claim 9, wherein the discrete second raised portions have two sides that are curved radially inward and a third side that is curved radially outward such that each discrete second raised portion is asymmetric about a central axis of the discrete second raised portion.

13. The substrate carrier of claim 9, wherein the base plate has an outer diameter of about 11.5 inches to about 12.5 inches.

14. The substrate carrier of claim 9, wherein the central substrate retaining surface and the plurality of peripheral substrate retaining surfaces are each configured to hold a substrate having a diameter of about 4.0 inches.

15. The substrate carrier of claim 9, wherein the base plate has a thickness of about 0.03 inches to about 0.05 inches.

16. A substrate carrier, comprising:
a base plate, wherein the base plate is a solid plate with no through holes or embedded components; and
a plurality of raised portions that are generally triangular shaped extending from the base plate, wherein the base plate and the plurality of raised portions define a plurality of pockets having a circular shape, wherein an outer surface of all of the plurality of raised portions are disposed radially inward of an outer surface of the base plate, wherein the plurality of pockets include a central pocket and six peripheral pockets, and wherein each of the six peripheral pockets are defined by a lesser number of the plurality of raised portions than a number of the plurality of raised portions defining the central pocket, and wherein the upper surface of the plurality of raised portions is entirely planar and sidewalls of the plurality of pockets extend at a substantially constant diameter from a lowermost surface of the plurality of pockets to the upper surface of the plurality of raised portions.

17. The substrate carrier of claim 16, wherein the base plate is made of silicon (Si), silicon carbide (Sic), or silicon-infiltrated, silicon carbide (SiSiC).

18. The substrate carrier of claim 16, wherein the plurality of pockets have a diameter of about 4.0 inches.

19. The substrate carrier of claim 16, wherein the plurality of raised portions have three sides that are curved.

20. The substrate carrier of claim 16, wherein the plurality of raised portions include a plurality of first raised portions defining the central pocket and a plurality of second raised portions, which along with the plurality of first raised portions, define the six peripheral pockets.

\* \* \* \* \*